United States Patent [19]

Nishizawa et al.

[11] Patent Number: 4,870,028
[45] Date of Patent: Sep. 26, 1989

[54] METHOD OF MAKING DOUBLE GATE STATIC INDUCTION THYRISTOR

[75] Inventors: Jun-ichi Nishizawa, Miyagi; Hisao Kondoh, Osaka, both of Japan

[73] Assignee: Mitsubishi Electric Corporation, Tokyo, Japan

[21] Appl. No.: 322,515

[22] Filed: Mar. 13, 1989

Related U.S. Application Data

[62] Division of Ser. No. 219,902, Jul. 14, 1988.

[30] Foreign Application Priority Data

Feb. 25, 1985 [JP] Japan .................. 60-39378

[51] Int. Cl.⁴ ............................................ H01L 21/20
[52] U.S. Cl. ........................................ 437/6; 437/203; 437/249
[58] Field of Search ............ 437/6, 203, 65, 228, 437/249; 357/38, 22 K, 55

[56] References Cited

U.S. PATENT DOCUMENTS

| | | | |
|---|---|---|---|
| 3,274,400 | 9/1966 | Weinstein | 357/38 |
| 3,684,902 | 8/1972 | Giuliano et al. | 357/38 |
| 3,953,254 | 4/1976 | Valdman | 357/38 |
| 4,171,995 | 10/1979 | Nishizawa | 437/6 |
| 4,341,011 | 7/1982 | Olcano et al. | 437/6 |
| 4,545,111 | 10/1985 | Johnson | 437/6 |
| 4,554,568 | 11/1985 | Champon et al. | 357/38 |
| 4,624,004 | 11/1986 | Calviello | 357/22 K |

*Primary Examiner*—Brian E. Hearn
*Assistant Examiner*—Tom Thomas
*Attorney, Agent, or Firm*—Kerkam, Stowell, Kondracki & Clarke

[57] ABSTRACT

A double gate static induction thyristor comprises an n⁻ semiconductor substrate having first and second principal surfaces opposite to each other. An n⁻ epitaxial semiconductor layer is formed on the first principal surface of the substrate, and a p⁻ epitaxial semiconductor layer is formed on the second principal surface of the substrate. A cathode electrode is deposited on the surface of the n⁻ epitaxial layer, and an anode electrode is deposited on the surface of the p⁻ epitaxial layer. In addition, a first gate electrode is formed on the first principal surface of the substrate, and a second gate electrode is formed on the second principal surface of the substrate.

7 Claims, 3 Drawing Sheets

METHOD OF MAKING DOUBLE GATE STATIC INDUCTION THYRISTOR

This is a divisional of application Ser. No. 219,902 field July 14, 1988.

FIELD OF THE INVENTION

The present invention relates to a buried-gate type double gate static induction thyristor, and more specifically to an easily fabricable double gate static induction thyristor and a manufacturing method therefor.

DESCRIPTION OF THE RELATED ART

The double gate static induction thyristors have already proposed and examined by various publications such as Japanese patent publication No 4100/1982, U.S. Pat. No. 4,086,611 and the Trans. Electron Devices, vol. ED-22 No. 4, pp 185-195 (1975). This double gate static induction thyristor can not only switch a large current at a very high speed, but also can be turned off by controlling the voltage of the gate, differently from conventional silicon controlled rectifiers.

FIG. 1 shows a schematic cross-sectional view of a typical example of the double gate static induction thyristors.

The shown thyristor is separated into an upper part and a lower part by a center p-n junction 26. The upper part includes a $p^-$-type semiconductor layer 25 contiguous to an $n^-$-type semiconductor layer 24 of the lower part so as to form the p—n junction 26 therebetween. Another $p^-$-type semiconductor layer 29 is formed on the layer 25, and in addition, $n^+$-type gate regions 27 are formed at a periphery of the layer 25 and also between the layers 25 and 29 in the form of buried regions. An anode electrode 30 is deposited on the second $p^{31}$-type layer 29. Furthermore, a second $n^-$-type semiconductor layer 21 is formed on the first $n^-$-type layer 24, and $p^+$-type gate regions 22 are formed at a periphery of the layer 24 and also between the layers 21 and 24 in the form of buried regions. In addition, a cathode electrode 31 is deposited on the second $n^-$-type layer 21, and gate electrodes 32 are deposited on the exposed gate regions 22 and 27.

Incidentally, in this specification, the term "$p^-$-type" is used to mean that p—type impurities are included or doped at a low concentration, and the "$p^+$-type" is used to mean that p—type impurities are included or doped at a high concentration. Further, the "$n^-$-type means that n-type impurities are included or doped at a low concentration, and the "$n^+$-type" means that n-type impurities are included or doped at a high concentration.

With the above mentioned arrangement, if the gate electrodes 32 are suitable biased, a current will flow from the anode 30 to the cathode 31 through current paths 28 formed between the gate regions 27 and current paths 23 formed between the gate regions 22, in such a manner that holes are injected from the anode 30 and electrons are injected from the cathode 31.

As can be known from the above explanation, the conventional double gate static induction thyristor is characterized in that the $p^+$-type first gate region 22 and the $n^+$-type second gate region 27 are separated on both sides of the p-n junction 26.

In order to manufacture such thyristors, the following two methods are widely used.

According to the first manufacturing method, a semiconductor substrate is prepared to constitute the $n^-$-type semiconductor layer 21. Then, the following operations are sequentially performed to the substrate 21:

(1) on an upper principal surface, or the first surface, of the $n^-$-type semiconductor substrate 21, the $p^+$-type gate regions 22 are selectively formed;

(2) the $n^-$-type semiconductor layer 24 is grown epitaxially on an upper principal surface of the $n^{31}$-type semiconductor substrate 21 including the surface of the $p^{30}$-type gate regions 22;

(3) the $p^-$-type semiconductor layer 25 is epitaxially grown on the $n^-$-type epitaxial layer 24;

(4) the $n^+$-type gate regions 27 are formed on the upper surface of the $p^-$-type epitaxial layer 25.

(5) the $p^-$-type semiconductor layer 29 is epitaxially grown on the $p^-$-type epitaxial layer 25 including the surface of the $n^+$-type gate regions 27.

(6) the $n^{31}$-type semiconductor substrate 21 is selectively etched to expose partially the first gate regions 22.

(7) the $p^-$-type semiconductor layer 29 is selectively etched to expose partially the second gate regions 27.

(8) the anode electrode 30, the gate electrodes 32 and the cathode electrode 31 are formed on the $p^-$-type epitaxial layer 29, the first and the second gate regions 22 and 27, and the $n^-$-type semiconductor substrate 21, respectively.

With this manufacturing method, three epitaxial layers are superposed or deposited in layers, which requires a highly controlled crystal growth technology, because it is difficult to deposite an epitaxial layer on another epitaxial layer without defect.

According to the other manufacturing method of the conventional double gate static induction thyristor, the $p^-$-type semiconductor lower layer 25 is provided by a substrate. Then, the following operations are sequentially performed to the substrate 25:

(1) on a lower principal surface of the $p^-$-type semiconductor substrate 25, the $n^-$-type semiconductor layer 24 is epitaxially grown;

(2) on an upper principal surface of the $p^-$-type semiconductor substrate 25, the $n^+$-type gate regions 27 are formed.

(3) the $p^-$-type semiconductor layer 29 is epitaxially grown on the substrate 25 including the $n^+$-type gate region 27;

(4) the $p^+$-type gate regions 22 are formed on the lower surface of the $n^-$-type epitaxial layer 24.

(5) the $n^-$-type semiconductor lower layer 21 is epitaxially grown on the $n^-$-type epitaxial layer 24.

(6) the $n^-$-type semiconductor layer 21 is selectively etched to expose the first gate regions 22.

(7) the $p^-$-type semiconductor layer 29 is selectively etched to expose the second gate regions 27.

(8) the anode electrode 30, the gate electrodes 32 and the cathode electrode 31 are formed on the $p^-$-type epitaxial layer 29, the first and the second gate regions 22 and 27, and the $n^-$-type epitaxial layer 21, respectively.

In this case, two epitaxial layers 24 and 21 are superposed or stacked on the lower principal surface of the substrate 25. Therefore, this method also requires a highly controlled crystal growth technology.

As mentioned above, the conventional double gate static induction thyristors have a plurality of superposed or stacked epitaxial layers which require the highly controlled crystal growth technology. Therefore, it has heretofore been difficult to manufacture double gate static induction thyristors on a mass-production basis. Accordingly, although the double gate static induction thyristors have been recognized to be more excellent than the conventional thyristors, they could not have been widely used in practice.

SUMMARY OF THE INVENTION

Accordingly, it is an object of the present invention to provide a double gate static induction thyristor which is simple in construction as compared with the conventional ones and therefore can be easily manufactured in comparison with the conventional ones.

Another object of the present invention is to provide a double gate static induction thyristor in which only one epitaxial layer is deposited on each principal surface of a semiconductor substrate.

Still another object of the present invention is to provide a method for manufacturing the above double gate static induction thyristor, which method does not require to stack a plurality of epitaxial layers to each other.

The above and other objects of the present invention are achieved in accordance with the present invention by a double gate static induction thyristor comprising a semiconductor substrate of a given conduction type having first and second principal surfaces opposite to each other, a first epitaxial semiconductor layer of a first conduction type formed on the first principal surface of the substrate, a second epitaxial semiconductor layer of a second conduction type opposite to the first conduction type and formed on the second principal surface of the substrate, a cathode electrode deposited on the surface of the first epitaxial layer, an anode electrode deposited on the surface of the second epitaxial layer, a first gate electrode formed on the first principal surface of the substrate, and a second gate electrode formed on the second principal surface of the substrate.

In one embodiment of the thyristor in accordance with the present invention, the substrate has a first gate region formed in the first principal surface and having the second conduction type, and a second gate region formed in the second principal surface and having the first conduction type. The above first and second gate electrodes are formed on the first and second gate regions, respectively.

In addition, the first and second epitaxial layers have highly doped surface regions, respectively, and the cathode and anode main electrodes are respectively deposited on the highly doped surface regions of the first and second epitaxial layers.

For example, the substrate is an n-type silicon substrate, and the first conduction type is n-type and the second conduction type is p-type. But, the substrate may be a p-type silicon substrate. Furthermore, the anode electrode and the first gate electrode are formed of a material having a work function larger than that of the associated semiconductor regions, and the cathode electrode and the second gate electrode are formed of a material having a work function smaller than that of the associated semiconductor regions. Specifically, the anode electrode and the first gate electrode are formed of a material selected from a group consisting of Pt and PtSi, and the cathode electrode and the second gate electrode are formed of a material selected from a group consisting of Al, Ti, Mo and their silicide.

More specifically, the substrate has the thickness of about 400–450 micrometers and the impurity concentration of $1 \times 10^{13}$ to $2 \times 10^{13}$ cm$^{-3}$, and the first and second gate regions are respectively formed in the first and second principal surfaces of the substrate to have the depth of 15 to 20 micrometers and the surface impurity concentration of $1 \times 10^{18}$ to $1 \times 10^{19}$ cm$^{-3}$. The first and second epitaxial layers are respectively formed on the first and second principal surfaces to have the thickness of about 30 micrometers at a relatively low impurity concentration. Preferably, the first and second epitaxial layers respectively have a first layer of about 1.5 micrometer thickness formed on the substrate to have a resistivity of 180 milliohms-centimeter, and a second layer of about 28.5 micrometer thickness formed on the first layer to have a resistivity of 20 ohms-centimeter. In addition, the highly doped surface region formed on each of the first and second epitaxial layers has a thickness of 7 micrometers and a surface impurity concentration of not less than $5 \times 10^{19}$ cm$^{-3}$.

Furthermore, the above mentioned double gate static induction thyristor can be manufactured by a method in accordance with the present invention, which comprises the steps of:

preparing a semiconductor substrate of a first conduction type having first and second principal surfaces opposite to each other;

selectively forming a first epitaxial layer of the first conduction type on the first principal surface of the substrate;

selectively forming a second epitaxial layer of a second conduction type opposite to the first conduction type, on the second principal surface of the substrate; and forming electrodes on the first and second principal surfaces and the surface of the first and second epitaxial layers so as to provide a first gate electrode, a second gate electrode a cathode electrode and an anode electrode, respectively.

Preferably, before formation of the first and second epitaxial layers, first and second gate regions are selectively formed in the first and second principal surfaces of the substrate, respectively, and the first and second gate electrodes are deposited on the first and second gate regions, respectively In this case, thefirst epitaxial layer is formed by the steps of depositing a first semiconductor layer of the first conduction type on the first principal surface of the substrate by means of an epitaxial growth process, and selectively removing the first epitaxial layer by an etching process to cause the first gate region to be exposed. Further, the second epitaxial layer is formed by the step of depositing a second semiconductor layer of the second conduction type on the second principal surface by means of an epitaxial growth process, and selectively removing the second epitaxial layer by an etching process to cause the second gate region to be exposed. Moreover, the surface of the first and second epitaxial layers are strongly doped by impurities of the first and second conduction types, respectively, and the cathode and anode electrodes are deposited on the strongly doped surfaces of the first and second epitaxial layers, respectively.

As seen from the above, only one epitaxial layer is formed on each principal surface of the semiconductor substrate in·the double gate static induction thyristor in accordance with the present invention. Therefore, a plurality of epitaxial layers do not superpose on each other. As a result, the conventional crystal growth technique can be applied in fabricating a double gate static induction thyristor, as seen from the above mentioned manufacturing process of the present invention.

The above and other objects, features and advantages of the present invention will be apparent from the following description of preferred embodiments of the invention with reference to the accompanying drawings.

BRIEF DESCRIPTION OF THE DRAWINGS

FIG. 28 is a view similar to FIG. 2A but showing a second embodiment of the double gate static induction thyristor.

DESCRIPTION OF THE PREFERRED EMBODIMENTS

Figure 1:
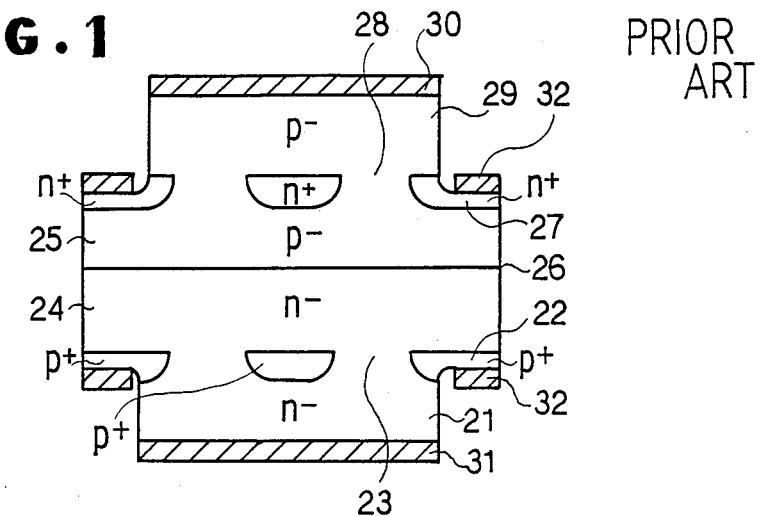
FIG. 1 is a sectional view showing a typical double gate static induction thyristor in the prior art.
Figure 2A:
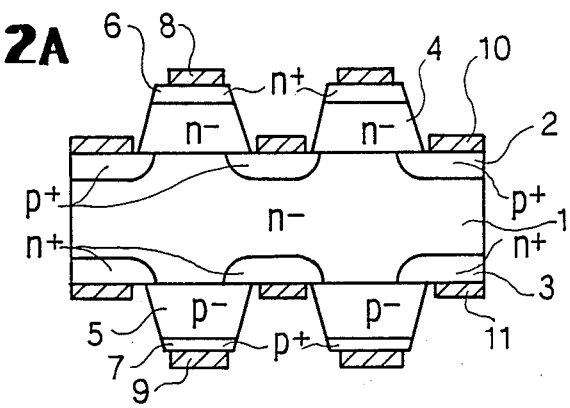
FIG. 2A is a sectional view showing a first embodiment of the double gate static induction thyristor in accordance with the present invention.

Referring to FIG. 2A, there is shown one embodiment of the double gate static induction thyristor in accordance with the present invention. The shown thyristor comprises an $n^-$-type silicon substrate 1, which has first gate regions 2 of $p^+$-type selectively formed in an upper principal surface thereof and second gate regions 3 of $n^+$-type also selectively formed in a lower principal surface of the substrate. In addition, epitaxial silicon layers 4 of $n^-$-type are selectively formed on the upper principal surface of the substrate 1 so as to overlie on a periphery of the first gate regions 2, and also, epitaxial silicon layer 5 of $p^-$-type are selectively formed on the lower principal surface of the substrate 1 so as to overlap on a peripheral portion of the second gate regions 3 These epitaxial layers 4 and 5 have their strongly doped top surface regions 6 and 7, respectively, on which cathode electrodes 8 and anode electrodes 9 are deposited, respectively Furthermore, first and second gate electrodes 10 and 11 are formed on the exposed surfaces of the first and second gate regions 2 and 3.

In the thyristor as mentioned above, the epitaxial layer 4 is formed on the upper principal surface of the substrate 1 and the epitaxial layer 5 is formed on the lower principal surface of the substrate 1. Namely, the two epitaxial layers 4 and 5 do not lie on each other. Therefore, since there is not required a highly controlled epitaxial growth technique for stacking a plurality of epitaxial layers, the above thyristor can be easily manufactured by the ordinary epitaxial growth technique.

Figure 2B:
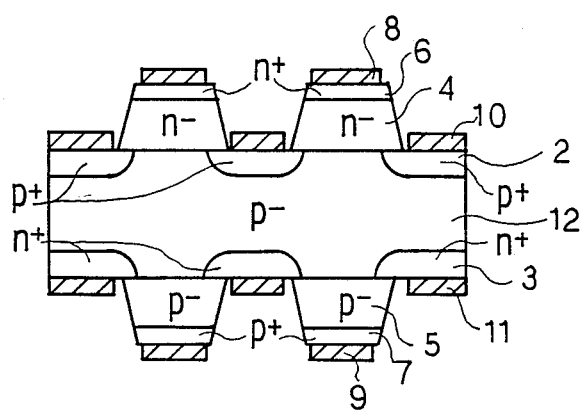

Turning to FIG. 2B, there is another embodiment of the thyristor in accordance with the present invention, in which a $p^-$-type silicon substrate 12 is used in place of the type substrate 1 in the first embodiment shown in FIG. 2A. In the other points, the second embodiment of FIG. 2B is the same as that of FIG. 2A.

In the following, a manufacturing process for the double gate static induction thyristor as shown in FIG. 2A will be explained in detail with reference to FIG. 3.

Figure 3A:
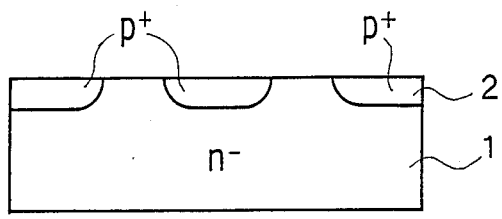
FIGS. 3A to 3I are sectional views illustrating the process for manufacturing the double gate static induction thyristor shown in FIG. 2A.

As shown in FIG. 3A, a $n^-$-type silicon substrate having a thickness of about 400–450 micrometers and an impurity concentration of $1 \times 10^{13}$ to $2 \times 10^{13}$ cm$^{-3}$ is prepared, and then, p+-type first gate regions 2 is formed partially on an upper principal surface, or the first surface, of the $n^-$-type silicon substrate 1 by selectively doping p-type impurities such borons at a high concentration.

Figure 3B:
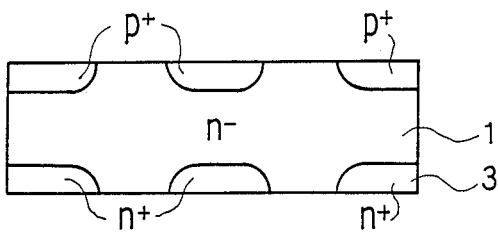

Further, as shown in FIG. 3B, n+-type second gate regions 3 is formed partially on a lower principal surface, or the second surface, of the n-type silicon substrate 1 by selectively doping n-type impurities such as phosphorus at a high concentration.

These gate regions 2 and 3 thus formed have the surface impurity concentration ranging for example from $1 \times 10^{18}$ to $1 \times 10^{19}$ cm$^{-3}$ and the depth in the range of 15 of 20 micrometers.

The above selective doping of impurities was performed by means of an ion implantation method and by using a suitable mask formed on the surface of the substrate and provided with necessary windows. If the substrate is left as it is after ions are implanted, the substrate shows very high surface specific resistivity, because defects appear in the substrate and most implanted ions do not yet become carriers. Therefore, in order to disappear defects and to change impurities into carriers, an annealing operation is performed. In the present case, the substrate is heated at first at about 500° C. Thereafter, the substrate is driven in at about 1200° C. so as to cause a high temperature diffusion, and then gradually cooled to nearly 560° C.

An alternative for impurity doping is a gas diffusion method. In this case, an oxide layer is first formed on the surface of the substrate. Then, by means of dry etching, gate region windows are formed, which will be a diffusion mask. Then, the substrate is heated in an atmosphere including impurities atoms, so that the impurities diffuse in the substrate through the windows to selectively form the gate regions.

Figure 3C:
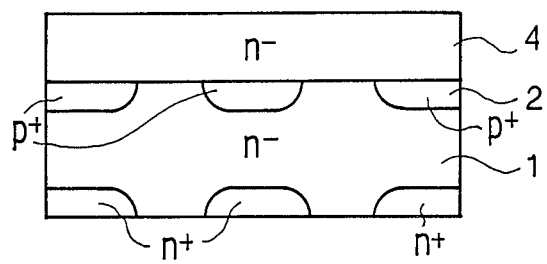

Thereafter, as shown in FIG. 3C, an $n^-$-type silicon region 4 containing a low concentration of n-type impurities such as phosphorus is epitaxially grown on the first or upper surface of the substrate 1. The thickness of this $n^-$-type epitaxial layer 4 is about 30 micrometers.

The epitaxial growth of the layer 4 is divided into two steps so as to suppress autodoping or outdiffusion from the gate regions 2 to the epitaxial layer 4: first, a first n-type silicon layer having a specific resistivity of 180 milliohms-centimeter is grown directly on the substrate 1 in about 1.5 micrometer thickness by means of a high impurity concentration epitaxial growth; and then a second n-type silicon layer of a specific resistivity in the range of 10 to 20 ohms-centimeter is grown with a thickness of about 28.5 micrometers by means of a low impurity concentration epitaxial growth. As for epitaxial growth, low pressure epitaxial growth method with lamp heating was preferably used.

Figure 3D:
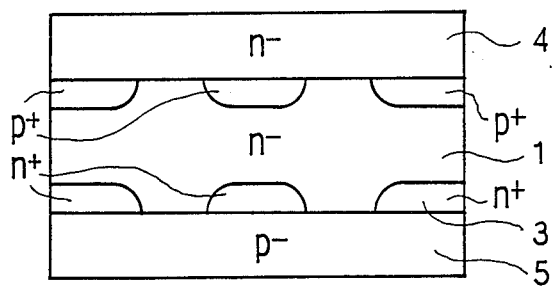

Further, as shown in FIG. 3D, a $p^{31}$-type silicon region 5 doped with p-type impurities such as borons at a low concentration is epitaxially grown on the second or lower i surface of the substrate 1. The thickness of this $p^{31}$-type epitaxial layer 5 is about 30 micrometers.

This epitaxial growth also proceeds in two steps just as has been done above: first, a first p-type silicon layer having a specific resistivity of 180 milliohms-centimeter is grown directly on the substrate 1 with about 1.5 micrometer thickness by a high impurity concentration epitaxial growth; and then, a second p-type silicon layer of a specific resistivity of 10 to 20 ohms-centimeter is grown at about 28.5 micrometer by a low impurity concentration epitaxial growth.

Figure 3E:
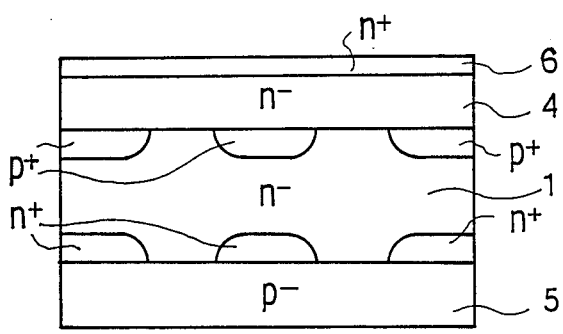

Next, as shown in FIG. 3E, an n+-type silicon layer 6 is formed on the entire surface of the $n^-$-type epitaxial layer 4 by doping n-type impurities such as phosphorus into the surface region of the epitaxial layer 4 so as to have, for example, an impurity concentration of not less than $5\times10^{19}$ cm$^{-3}$ and the thickness of 7 micrometers.

Figure 3F:
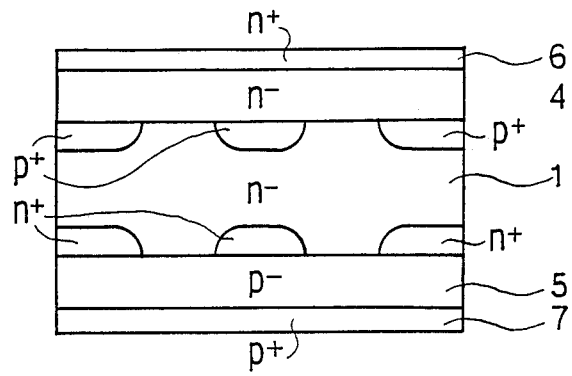

As shown in FIG. 3F, an p$^+$-type silicon layer 7 is formed on the entire surface of the p$^-$-type epitaxial layer 5 by doping n-type impurities such as phosphprus with an impurity concentration of not less than $5\times10^{19}$ cm$^{-3}$ and in the thickness of 7 micrometers.

Figure 3G:
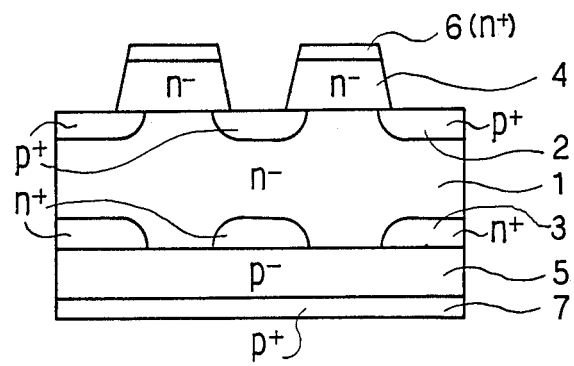
Figure 3H:
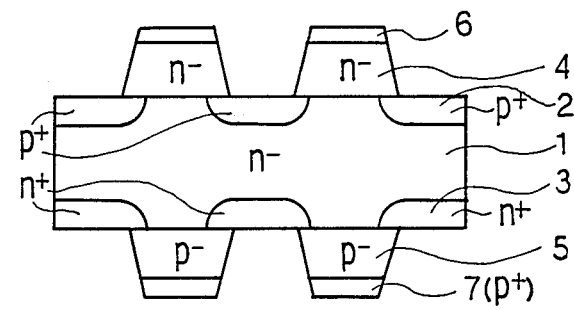

Further, as shown in FIG. 3G, a part of the n$^-$-type epitaxial layer 4 and the n$^+$-type surface region 6 are etched to expose p$^+$-type first gate regions 2. And as shown in FIG. 3H, a part of the p$^-$-type epitaxial layer 5 and the p$^+$-type surface region 7 are etched to expose the p$^+$-type second gate regions 3.

Figure 3I:
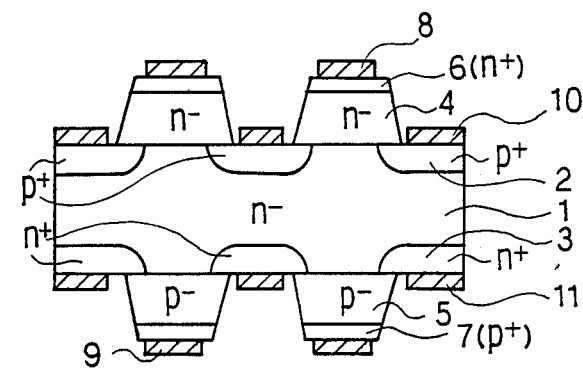

Finally, as shown in FIG. 3I, cathode electrodes 8, first gate electrodes 10, anode electrodes 9 and second gate electrodes 11 are formed on the n$^+$-type surface regions 6, the p$^+$-type first gate regions 2, the p$^+$-type surface regions 7 and the p$^+$-type first gate regions 3, respectively.

As for the material for the first electrode 10 and the anode electrode 9, there can preferably used metals or metal silicides such as Pt, PtSi, etc. having a work function larger than the silicon. In contrast, metals or metal silicides such as Al, Ti, Mo, MoSi, etc. having a work function smaller than the silicon are preferably used as the material for the cathode electrode 8 and the second gate electrode 11. Concerning electrodes, not only metals or metal silicides themselves, but also multi layered structure of two or more kinds of metals or metal silicides may be used.

Explanation so far has been done on the thyristor shown in FIG. 2A. However, there is no great difference in manufacturing a thyristor shown in FIG. 2B. The only difference is that a p$^-$-type semiconductor substrate 12 is used instead of the n$^-$$^-$semiconductor substrate 1. Therefore, the operations performed to the n$^-$-type semiconductor substrate 1 apply also to the p$^-$-type semiconductor substrate 12.

As can be known from the explanation above, the thyristor according to the present invention has an advantage that the structure is simpler than that of the prior art. Another advantage is found in the manufacturing method in which epitaxial growth layers are not superposed. Therefore, no specific crystal growth technique is required, resulting in the possibility of applying the technique in the prior art in manufacturing the thyristor according to the invention.

The invention has thus been shown and described with reference to specific embodiments. However, it should be noted that the invention is in no way limited to the details of the illustrated structures but changes and modifications may be made within the scope of the appended claims.

We claim:

1. A method for manufacturing a double gate static induction thyristor comprising the steps of:

preparing a semiconductor substrate of a first conduction type having first and second principal surfaces opposite to each other;

selectively forming a first epitaxial layer of the first conductor type on the first principal surface of the substrate;

selectively forming a second epitaxial layer of a second conduction type opposite to the first conduction type, on the second principal surface of the substrate; and forming electrodes on the first and second principal surfaces and the surface of the first and second epitaxial layers so as to provide a first gate electrode, a second gate electrode, a cathode electrode and an anode electrode, respectively.

2. A method as claimed in claim 1 wherein the first epitaxial layer is formed by the steps of depositing a first semiconductor layer of the first conduction type on the first principal surface of the substrate by means of an epitaxial growth process, and selectively removing the first epitaxial layer by an etching process to cause a portion of the first principal surface to be exposed.

3. A method as claimed in claim 1 wherein the second epitaxial layer is formed by the steps of depositing a second semiconductor layer of the second conduction type on the second principal surface of the substrate by means of an epitaxial growth process, and selectively removing the second epitaxial layer by an etching process to cause a portion of the second principal surface to be exposed.

4. A method as claimed in claim 1 wherein before formation of the firs and second epitaxial layers, first and second gate regions are selectively formed in the first and second principal surfaces of the substrate, respectively, and wherein the first and second gate electrodes are deposited on the first and second gate regions, respectively.

5. A method as claimed in claim 4 wherein the first epitaxial layer is formed by the steps of depositing a first semiconductor layer of the first conduction type on the first principal surface of the substrate by means of an epitaxial growth process, and selectively removing the first epitaxial layer by an etching process to cause the first gate region to be exposed.

6. A method as claimed in claim 4 wherein the second epitaxial layer is formed by the steps of depositing a second semiconductor layer of the second conduction type on the second principal surface of the substrate by means of an epitaxial growth process, and selectively removing the second epitaxial layer by an etching process to cause the second gate region to be exposed.

7. A method as claimed in claim 1 wherein the surfaces of the first and second epitaxial layers are strongly doped by impurities of the first and second conduction types, respectively, and the cathode and anode electrodes are deposited on the strongly doped surfaces of the first and second epitaxial layers, respectively.

* * * * *